United States Patent
Yuhara et al.

[11] Patent Number: 5,144,185
[45] Date of Patent: Sep. 1, 1992

[54] SAW DEVICE

[75] Inventors: Akitsuna Yuhara, Kawasaki; Jun Sasaki, Sagamihara; Hiromi Isomae, Nakaminato; Shozi Kawakubo, Ibaraki; Jun Yamada, Yokohama, all of Japan

[73] Assignee: Hitachi, Ltd., Tokyo, Japan

[21] Appl. No.: 549,643

[22] Filed: Jul. 9, 1990

Related U.S. Application Data

[63] Continuation of Ser. No. 263,078, Oct. 27, 1988, abandoned, which is a continuation of Ser. No. 2,286, Jan. 12, 1987, abandoned.

[30] Foreign Application Priority Data

Jan. 13, 1986 [JP] Japan .................................. 3428/86
Mar. 5, 1986 [JP] Japan ................................. 46138/86

[51] Int. Cl.$^5$ ............................................ H01L 41/08
[52] U.S. Cl. ........................... 310/313 B; 310/313 D; 310/363; 310/364
[58] Field of Search ................. 310/313, 363, 364, 311; 333/150-155, 193-196

[56] References Cited

U.S. PATENT DOCUMENTS

| | | | |
|---|---|---|---|
| 4,489,250 | 12/1984 | Ebata et al. | 310/313 A |
| 4,635,009 | 1/1987 | Ebata et al. | 310/313 D |
| 4,775,814 | 10/1988 | Yuhara et al. | 310/364 X |

Primary Examiner—Mark O. Budd
Attorney, Agent, or Firm—Antonelli, Terry, Stout & Kraus

[57] ABSTRACT

A SAW device having a piezoelectric substrate and interleaved metal electrodes formed on the substrate, in which the formation of the electrodes on the substrate is carried out by sputtering. Further, the metal electrodes may contain an additive of Cu, Ti, Zn, Mg, Fe, Ni, Cr, Ga, Ge, Sn, Pd or Ta. The resulting SAW device is capable of dealing with high frequency electric signals of a larger amplitude, or higher power electric signals, as compared with the conventional SAW device.

4 Claims, 5 Drawing Sheets

FIG. I
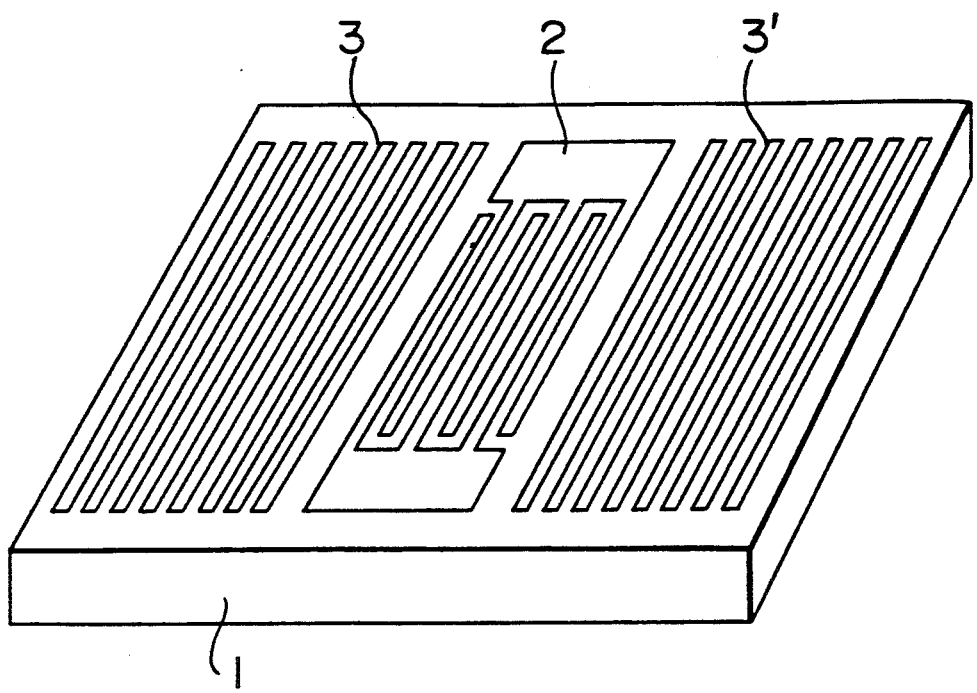
FIG. 2
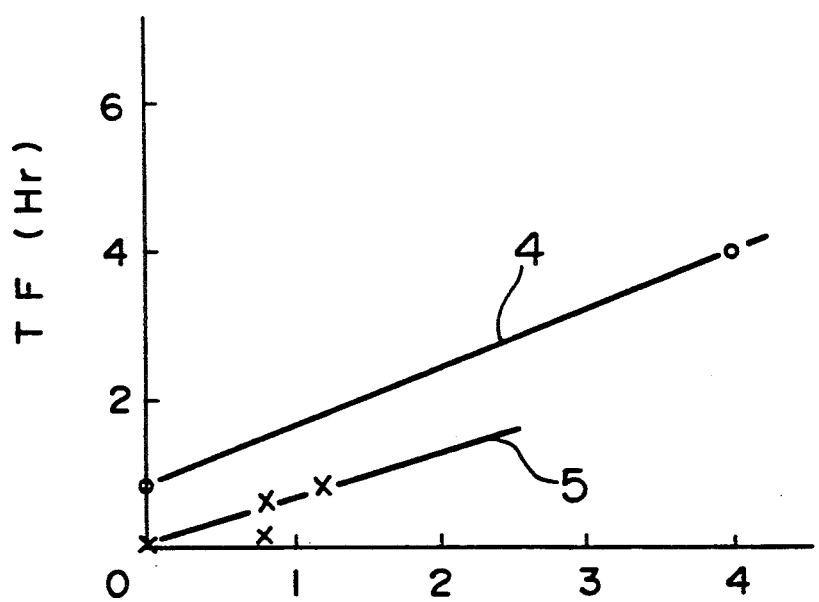
CONTENT OF ADDED ELEMENT IN ELECTRODES
(wt %)

SAW DEVICE

This application is a continuation of application Ser. No. 07/263,078, filed on Oct. 27, 1988, which is a continuation of application Ser. No. 07/002,286, filed Jan. 12, 1987.

BACKGROUND OF THE INVENTION

The present invention generally relates to a surface acoustic wave device (hereinafter referred to as SAW device in abbreviation). More particularly, the invention concerns a SAW device capable of handling electric signals of high power and/or a large amplitude.

At present, the SAW device finds a wide range of utilization and application and is employed as a SAW filter adapted for transmission of high electric power or as a SAW resonator in which surface wave of a large amplitude is continuously present as a standing wave. However, the SAW devices mentioned above suffer shortcomings in that defects similar to hillocks, voids or the like due to electro-migration which take place in Al-metallized electrodes in semiconductor IC devices are produced in fine fingers of aluminium (Al) serving as SAW transmission/reception electrodes and reflector electrodes in the SAW devices, as is reported in "Thin Solid Films", 64, 9–15 (1979) (J. I. Latham et al), pp. 9–14 and "Transactions of The Institute Of Electronics Communication Engineers of Japan", Vol. J67-C, pp. 278–285 (Mar., 1984). Under the circumstances, SAW resonators undergo unwanted phenomenon such as frequency deviation or shift from the resonance frequency. On the other hand, in the case of the SAW filter designed for high power transmission, there often arise failures such as shortcircuit, wire breakage and the like due to the growth of hillocks, as is reported in "1983 IEEE Ultrasonic Symposium Proceedings", pp. 83–86 (1983). In particular, the second mentioned literature explains the generating mechanism of such failure as follows: "Strain in a substrate surface produced by the SAW induces an internal stress in the Al-thin film formed on the substrate surface, as a result of which Al-crystalline grain boundary is migrated in a region where the stress exceeds a threshold, giving rise to creation of the voids and hillocks. The migration of the grain boundary is believed to be ascribable to such mechanism as experienced in the thermal cycle of ICs, as reported in IEEE Trans, Parts, Hybrids and Packaging, Vol. PHP-7, pp. 134–138, Sep. 1971". The first to third literatures mentioned above disclose that the failures due to Al-migration can be dealt with by adding a small amount (1 to 4 wt. %) of copper (Cu) to Al forming the conductors in the semiconductor ICs and that this method is effective for suppressing the migration.

It is, however, noted that none of these first to third literatures mentioned above discloses any suggestion concerning formation of electrodes of the SAW device by sputtering. As the frequency becomes higher, the strains due to SAW become greater even when the power for transmission and the amplitude remain unchanged. Under the circumstances, in the case of the SAW resonator designed for handling signals of frequencies higher than 300 MHz such as a SAW filter employed in a transmitter of a cellular radio telephone system of a 800 MHz-band and the like, above all, an adequate useful life can not be assured because of occurrence of the above-mentioned migration in operation with high power and/or a large amplitude even with the Al-electrode added with Cu and formed through vacuum evaporation or EB evaporation disclosed in the first to third literatures enumerated above.

It is further noted that formation of Al-film containing an additive of Cu through the vacuum evaporation or EB evaporation tends to increase the hardness of the film, making it difficult to employ the wire bonding to another disadvantage. On the other hand, when a dry etching process is adopted for forming fine electrodes with a high precision for the purpose of enhancing the high frequency performance, the electrodes are susceptible to corrosion or the like injuries (e.g., due to the inclusion of Cl), giving rise to a problem that the yield is degraded significantly.

Another method of suppressing the electromigration is disclosed in "Semiconductor World" pp. 108–116, (July 1985) and others. According to this method, the crystal grain diameter of metal of which the deposited film is made is increased to suppress the electromigration. As specific means for increasing the crystal grain diameter in the thin film, a vacuum vapor evaporation method by resorting to the resistance heating as disclosed in the above-mentioned Transactions of The Institute of Electronics and Communication Engineers of Japan and a vacuum vapor evaporation method resorting to the use of an electron beam are adopted.

However, in the hitherto known vacuum vapor evaporation methods in which the resistance heating and the electron beam are employed, respectively, the concentration of an additive in each evaporation source becomes frequently non-uniform, the mean additive concentrations are different among the batches, and the vapor pressures and masses of individual elements are different from one another, which cause variations of the concentration or content of an additive in films among the individual lots or batches. As a consequence, it is impossible or at least very difficult to ensure an adequately long useful life for the SAW device provided with the Cu-added Al-electrodes formed through the vapor deposition based on the use of the vacuum evaporation or the electron beam evaporation, when the device is operated with high power (or a large amplitude) at high frequency even in case the power or amplitude remains unchanged, because of non-uniformity of the additive.

SUMMARY OF THE INVENTION

An object of the present invention is to provide a SAW device which can be operated at a high frequency with high power (with surface acoustic waves of a large amplitude).

Another object of the present invention is to provide a SAW device possessing the features mentioned above and having electrodes which are suited to be realized in a fine structure or pattern for high frequency operation and facilitate adoption of dry etching and/or wire bonding procedure.

Heretofore, Al is deposited by the vacuum evaporation, EB (electron beam) evaporation or the like for forming an Al-film on a substrate of a piezo-electric material for the purpose of forming electrodes for a SAW device. In contrast, it should be noted that the use of a sputtering method for forming the Al-film has never heretofore been conceived in view of the high expensiveness of the equipment for carrying out the sputtering and because of lack of recognition of advantages provided by the sputtering method which can sufficiently offset the cost required for the sputtering equipment.

In the course of reaching the present invention, examination has been experimentally made on the control of concentration or content of an additive in the vacuum evaporation process and the electron beam evaporation comparatively and also on the control of the concentration of an additive in the sputtering method. The results of the experimental examination has revealed that the additive content control can be performed through the sputtering method without any appreciable difficulty. Additionally, notwithstanding the generally accepted fact that the useful life of the SAW device is extended as the grain size in the thin film is increased in the light of the Al-migration in LSI wiring, the inventors of the present invention have formed electrodes for a high-frequency SAW device by resorting to the sputtering method which is commonly considered to be disadvantageous in respect of the grain size and the high power handling capability when compared with those formed through the vacuum evaporation method and the EB evaporation method, and tested the devices concerning the power handling capability. As the result, it has been surprisingly found that the power handling capability can be significantly improved over the conventional devices whose electrodes are formed through the vacuum evaporation method or the electron beam evaporation method.

In other words, the inventors of the present invention have first established and confirmed the fact that an alloy thin film of uniform composition can be realized with a high reproducibility, the film having an increased adhesion to an underlying layer (or a substrate) through the sputtering method and that the power handling capability of the device can be remarkably improved by adopting the sputtering method in the implementation of the SAW device.

Thus, according to one aspect of the present invention, metallic electrodes in a SAW device are formed by a sputtering method. The metallic electrodes of the device may be typically made of aluminium (Al). Addition of copper (Cu) to Al for making the electrodes by the sputtering method is effective for suppressing migration of the grain boundaries therein. Since defects such as hillocks and voids can be prevented from occurring in the electrodes by adopting the sputtering method, characteristics of the SAW device can be protected against degradation stemming from transmission of high power or excitation of acoustic wave of a large amplitude in the form of a standing wave.

According to another aspect of the present invention, Ti may be used instead of Cu as an element to be added to the metallic material for the electrodes of the SAW device and that the sputtering method which is excellent in respect of the stability of composition should be adopted in place of the vacuum or EB evaporation method. In the SAW device thus realized, it has been established that the power handling capability is far excellent over the conventional SAW device with electrodes formed of Al added with Cu. Additionally, advantageous unique effects which could not be expected from the application to the LSI could be confirmed with regard to reduced power transmission loss.

When compared with the boiling point of chloride $CuCl_3$ of Cu, that of chloride $TiCl_4$ of Ti is low. Consequently, Ti-added Al is very susceptible of the dry etching. Further, since excessive increase of the film hardness is prevented, the wire bonding can be facilitated.

According to the present invention, there may be provided SAW devices such as SAW filters, SAW resonators and the like which are prevented from deterioration of the characteristics at relatively high excitation levels and which can enjoy enhanced reliability.

Further, according to the present invention, there may be provided an electrode array and a reflector electrode array advantageously suited for use in a SAW device capable of transmitting high power with high reliability and a SAW resonator in which an acoustic wave of a large emplitude is present as a standing wave.

BRIEF DESCRIPTION OF THE DRAWINGS

FIG. 1 is a perspective view showing a SAW device according to an exemplary embodiment of the present invention.

FIG. 2 is a diagram for graphically illustrating the results of an accelerated life test conducted on SAW devices according to an embodiment of the invention and the SAW device shown in FIG. 1.

DESCRIPTION OF THE PREFERRED EMBODIMENTS

Figure 3:
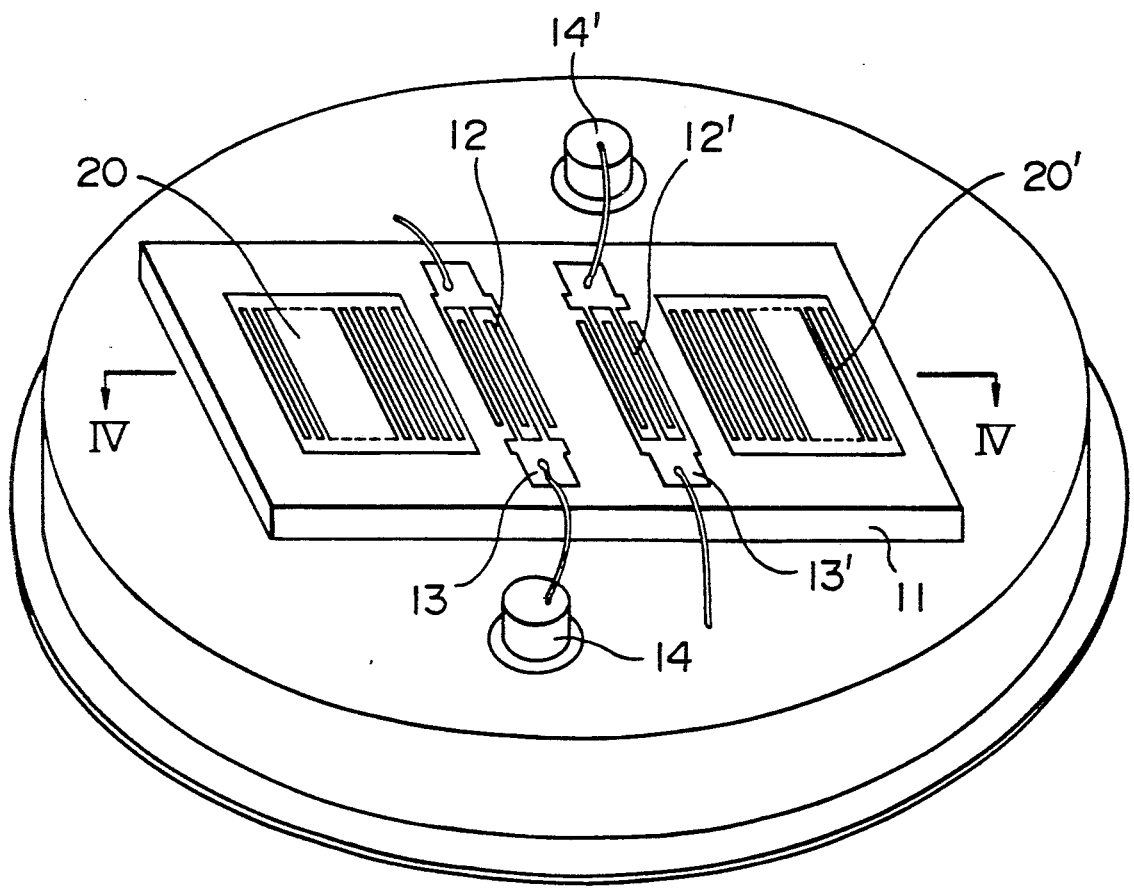
FIGS. 3 and 4 are, respectively, perspective and sectional views showing a SAW device realized in the form of a two-port SAW resonator according to another embodiment of the present invention.

Now, the invention will be described in detail in conjunction with preferred and exemplary embodiments by referring to the attached drawings.

FIG. 1 shows in a perspective view a one-port SAW resonator to which a SAW device according to an embodiment of the invention is applied. In the figure, a reference numeral 1 denotes a piezoelectric SAW substrate, 2 denotes a set of interleaved electrodes arrayed in a comb-like pattern, and reference numerals 3 and 3' denote reflector electrodes, respectively.

Referring to FIG. 1, there are disposed on a surface of the SAW substrate 1 formed of a ST-cut quartz crystal a set of interleaved comb-like electrodes 2 with the aperture of 1000 μm and 28 pairs of fingers for transmitting or receiving surface acoustic waves. Transfer of electric signals with external circuits is effected by way of common bus electrode portions of the comb-like electrodes.

Further, 750 reflector electrodes 3 and 3' of metallic strips formed simultaneously with the comb-like electrodes 2 are disposed on both sides of the latter to thereby constitute a one-port SAW resonator. In the version of the device shown in FIG. 1, the reflector electrodes may be constituted by slits formed in the substrate 1 in place of the metallic strips.

It should be mentioned here that the SAW resonator described above has a resonance frequency of 690 MHz and Q of 3000.

Figure 5:
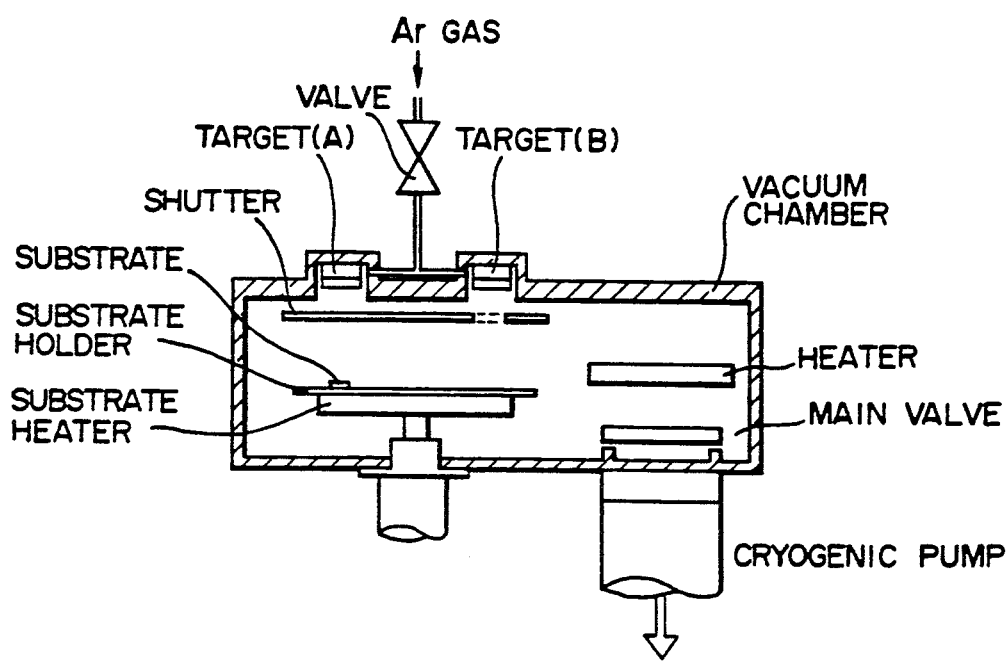
FIG. 5 is a schematic view showing an exemplary arrangement of a DC sputtering apparatus which may be employed in carrying out the present invention.

The comb-like electrodes 2 and the reflector electrodes 3 and 3' of the SAW resonator described above are each realized with a film thickness of 0.1 μm and formed through deposition of a pure Al-film by using a DC magnetron sputtering system, which film is subsequently photo-etched to form the electrode patterns. The sputtering system as employed is schematically shown in FIG. 5. The sputtering conditions are as follows.

| Heating temperature of substrate 1 | 200° C. |
|---|---|
| Flow rate of Ar-gas | 20 SCCM |
| Pressure of Ar-gas | 1.2 Pa |
| Sputtering power | 0.6 kW |

FIG. 2 is a characteristic diagram illustrating the results of an accelerated life test conducted on the SAW devices described above comparatively with the results of the test conducted on SAW resonators having comb-like electrodes and reflector electrodes formed through an electron beam evaporation. Additionally, FIG. 2 illustrates the results of a test performed on SAW devices having comb-like electrodes and reflector electrodes formed of Al added with Cu.

In FIG. 2, content (percent by weight) of the element Cu added to Al in forming the electrode film is taken along the abscissa, while the time at which the resonance frequency changes is taken along the ordinate in terms of time failure (FT) in hour (Hr).

The accelerated life test was conducted under the condition that the ambient temperature of the SAW devices was 120° C. and the input power was 100 mW.

In FIG. 2, a curve 4 represents the results of the accelerated life test conducted on the SAW devices according to the embodiment of the invention in which the electrode film was formed by using the DC magnetron sputtering system, and a curve 5 represents the results of the accelerated life test performed on the conventional SAW devices having the electrode films formed through the electron beam evaporation for the purpose of comparison.

As will be seen in FIG. 2, when the comb-like electrodes 2 and the reflector electrodes 3, 3' are formed purely from the Al-film, i.e. when the content of the added element is zero (wt %), the SAW device formed with the aid of the DC magnetron sputtering system exhibits several times longer time to failure (FT) and higher power handling capability than the device having the electrodes formed through the electron beam evaporation.

It will further be seen that the SAW device having the electrodes formed of Al added with Cu exhibits twice or more longer time to failure (TF) and higher power handling capability than the conventional SAW device.

The improvement of the power handling capability as a result of use of the DC magnetron sputtering system according to the present invention may be explained by the fact that the deposited film is of uniformalized quality, providing a cause for the increased mechanical strength of the deposited film.

The embodiment of the invention described above is directed to a one-port SAW resonator having electrodes formed of metallic strips of Al or Cu-added Al. However, the invention is not restricted to the additive of Cu, but another additive such as Ti, Zn, Mg, Fe, Ni, Cr, Ga, Ge, Sn, Pd or Ta may be employed. Further, the invention can be applied not only to the one-port SAW resonator but also to a two-port SAW resonator, a SAW filter for high power transmission or a SAW transmitter/receiver for use as the resonator.

Furthermore, the SAW substrate which can be used is not restricted to the ST-cut quartz crystal but other substrates such as of $LiNbO_3$, $LiTaO_3$ and the like can be used. Besides, substrates of various cut-face orientations may also be used.

In the above-described embodiments, the power handling capability of the SAW device can be increased without need for adding a large amount of additive element such as Cu according to the illustrated embodiment. Besides, since the element to be added may be of a small amount, occurrence of failure in the contact realized by the wire bonding can be prevented. In this manner, there can be provided a SAW device which is immune to the drawbacks of the conventional SAW devices and can enjoy excellent function and performance.

Figure 4:
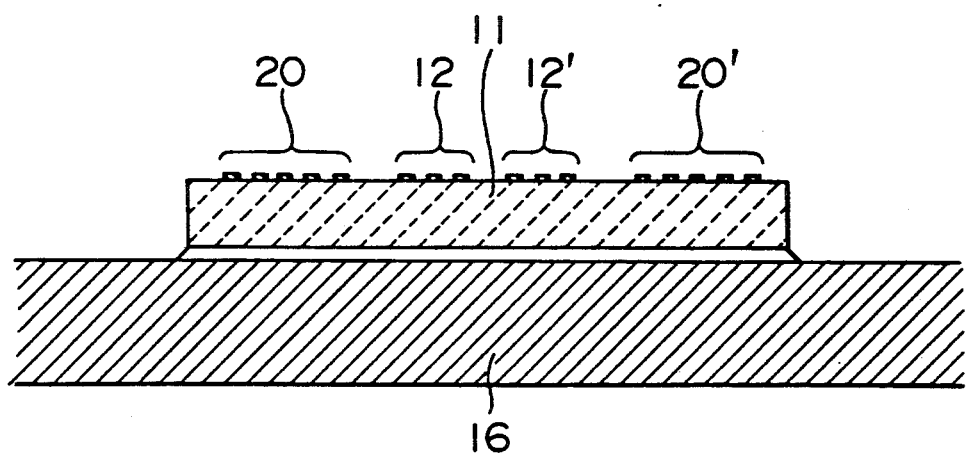

Description will now be made on another embodiment by referring to FIGS. 3 and 4 in which FIG. 4 is a view showing a cross-section taken along the line IV—IV in FIG. 3. Referring to the figures, a reference numeral 11 denotes a piezoelectric SAW substrate formed of ST-cut quartz crystal on which a pair of transmitting and receiving electrode arrays 12 and 12' are disposed, each array including 28 pairs of fingers with aperture thereof being 1000 μm for mutually transmitting and receiving SAW. The electrodes are connected to bonding pads 13, 13' by way of bus electrodes, while the bonding pads 13, 13' are electrically connected to input/output pins 14 and 14' of a stem of a can package by means of bonding wires of Al or Au. The bus electrodes located on the ground side of the transmitting/receiving electrodes are grounded to the stem 16 of the can package through the grounding bonding pads. Each of the pair of electrodes 12 and 12' includes one set of interleaved comb-like finger electrodes. Disposed on both sides of the aforementioned pair of transmitting/receiving electrodes 12 and 12' are reflector electrodes 20 and 20' composed of 750 metallic strips to thereby constitute a two-port SAW resonator. In the version of this embodiment, the metallic strips 20 may be replaced by slits formed in the substrate 11 serving as the reflectors. Each of the aforementioned transmitting-/receiving electrodes 12, 12' and the reflector electrodes has a film thickness of 0.1 μm. The two-port SAW resonator thus realized has a resonance frequency of 697 MHz and Q approximately equal to 4000. The electrode material is Al added with 2 wt % of Ti. The Ti-added Al film was deposited by a DC magnetron sputtering system which is best suited for this type of metallic film among various sputtering methods. After deposition of the film, the electrode pattern was formed through photoetching process. FIG. 5 schematically shows, by way of example, a DC magnetron sputtering apparatus which may be employed for fabricating the two-port SAW device according to the instant embodiment of the invention. The sputtering conditions may be selected, for example, as follows:

| Heating temperature of substrate 11 | 200° C. |
|---|---|
| Flow rate Ar-gas | 20 SCCM |
| Pressure of Ar-gas | 1.2 Pa |

| -continued | |
|---|---|
| Sputtering power | 0.6 kW |

Figure 6:
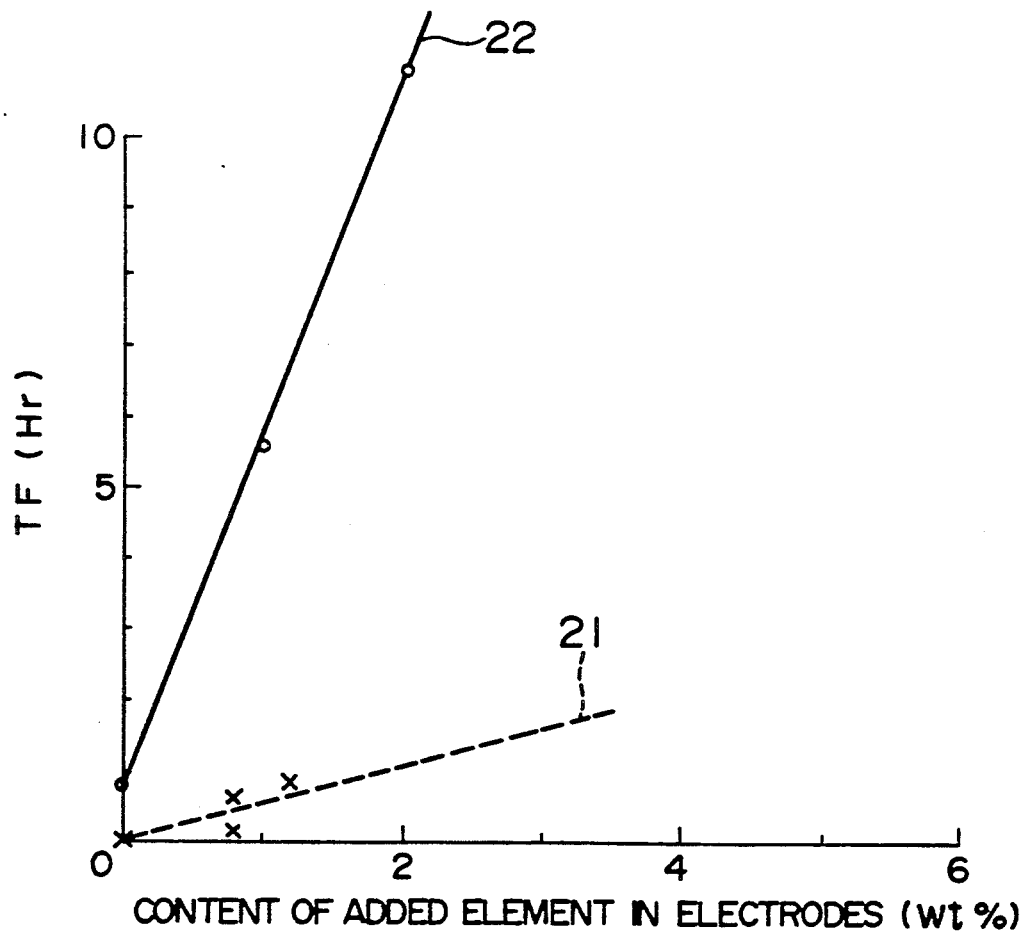
FIG. 6 is a characteristic diagram illustrating the result of an accelerated life test conducted on the apparatus according to an embodiment of the invention and the SAW device shown in FIGS. 3 and 4.

The result of the accelerated test conducted on the SAW resonators according to the instant embodiment is graphically illustrated in FIG. 6 comparatively with that of specimen manufactured by EB evaporation of Cu-added Al. The content of the added element in the film is taken along the abscissa in percent by weight while the time to failure (TF) is taken along the ordinate. The time to failure indicates the time elapse until the resonance frequence changes as in FIG. 2. The conditions for the accelerated life test are selected such that the temperature is 120° C. and that the input power is 100 mW. In FIG. 6, a curve 21 represents the result of the experiment performed on the specimen realized through EB evaporation of Cu-added Al employed for comparison, while a curve 22 represents the result of the accelerated life test performed on the resonators incorporating the Ti-added Al electrodes formed by sputtering. As will be seen from FIG. 6, the time to failure of the resonator provided with the Ti-added Al electrodes formed by sputtering is increased to ten times or more as compared with that of the specimen with the power handling capability being also increased significantly. In FIG. 6, curve 22 further represents the result of the test performed on the devices having electrodes formed purely of Al without addition of Ti. As will be seen, the time to failure (TF) of this device is also increased when compared with the specimen which increment is attributable to the adoption of the sputtering for the deposition of electrode film in place of the EB evaporation or vacuum evaporation. Although an advantage of reduced dispersion of composition among the batches due to the adoption of the sputtering was initially expected, the enhanced power handling capability is the utterly unexpected effect. It is believed that the enhanced power handling capability is explained by the fact that the mechanical strength of the electrode film is increased through adoption of the sputtering method.

Figure 7:
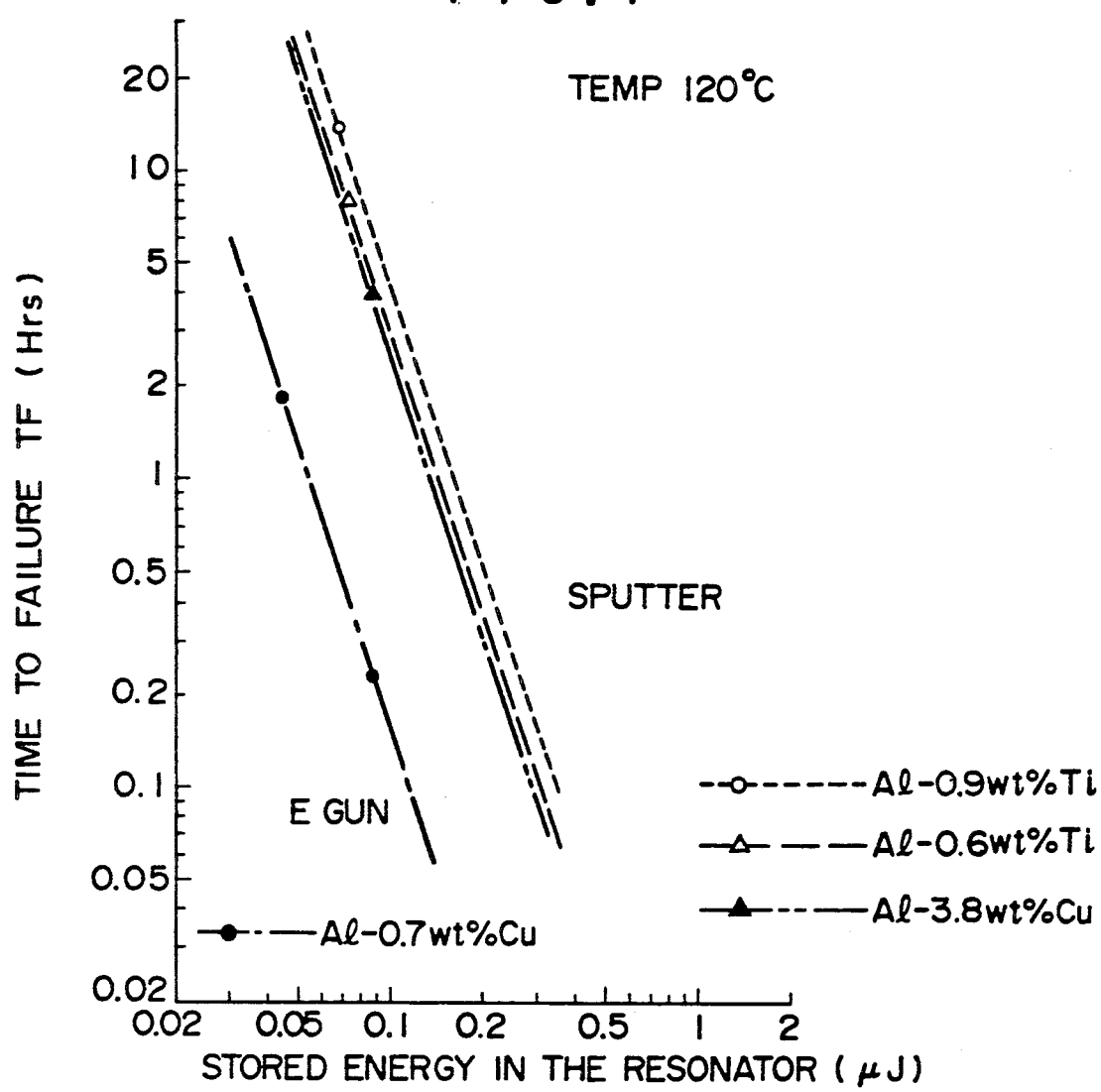
FIGS. 7 and 8 are diagrams for illustrating characteristics of SAW devices according to an embodiment of the invention and the SAW device shown in FIGS. 3 and 4.

For demonstrating the effects of the SAW resonator according to the instant embodiment, FIG. 7 show the result of the accelerated life test with energy stored in the resonator taken along the abscissa while the time to failure (TF) is taken along the ordinate. From the figure, it can be estimated that the SAW resonator resonator having electrodes formed of Al added with 0.9 wt % of Ti (value determined through analysis of the film) can enjoy the substantially equal useful life to that of the device having electrodes formed through EB evaporation, even with applied power three times as high as the one applied to the latter.

Figure 8:
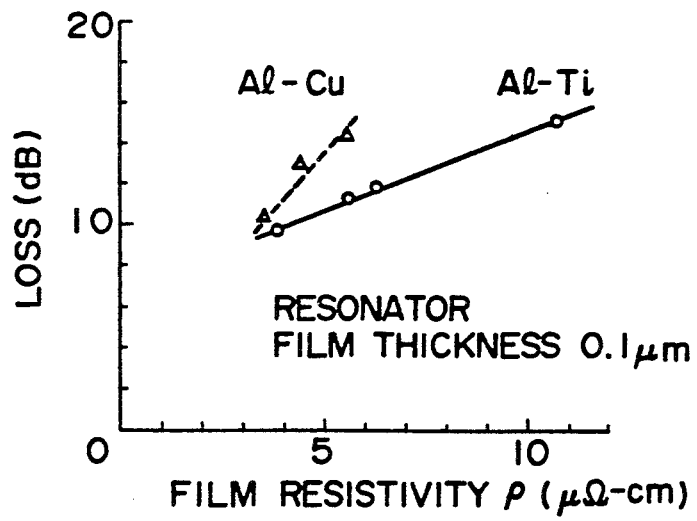

Another effect of the device according to the instant embodiment is illustrated in FIG. 8 in which the film resistivity is taken along the abscissa with the power loss produced in passing the resonator being taken along the ordinate. It will be seen that the power loss is significantly reduced in the case of the SAW resonator having Al-Ti electrodes according to the instant embodiment when compared with the conventional device having Al-Cu electrodes with the same resistivity. These effects attributable to the adoption of the sputtering and the additive can not be expected at all from the effect resulting from addition of Ti to the metallization of Al for LSI. They are the advantageous effects of the SAW device obtained through adoption of the sputtering method and addition of the element taught by the present invention. It is believed that these effects are considered to be ascribable not only to the increased mechanical strength and increased adhesion of the film but also to the appropriate hardness and the stress characteristics of the film.

The content of the additive Ti may amount up to 2 wt % without any problems for practical application of the SAW device in the permissible resistivity range of 10 to 11 $\mu\Omega$cm. It appears that the content of 4 wt % defines the permissible upper limit of resistivity (about 20 $\mu\Omega$cm) from the characteristic standpoint of the SAW device.

Figure 9:
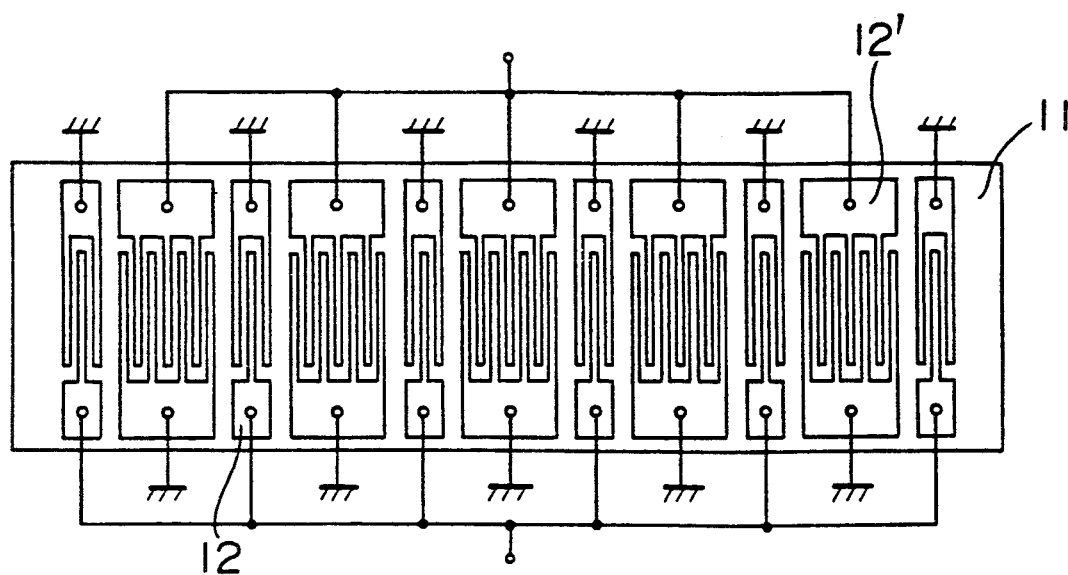
FIGS. 9 and 10 are views showing SAW devices according to other embodiments of the present invention.
Figure 10:
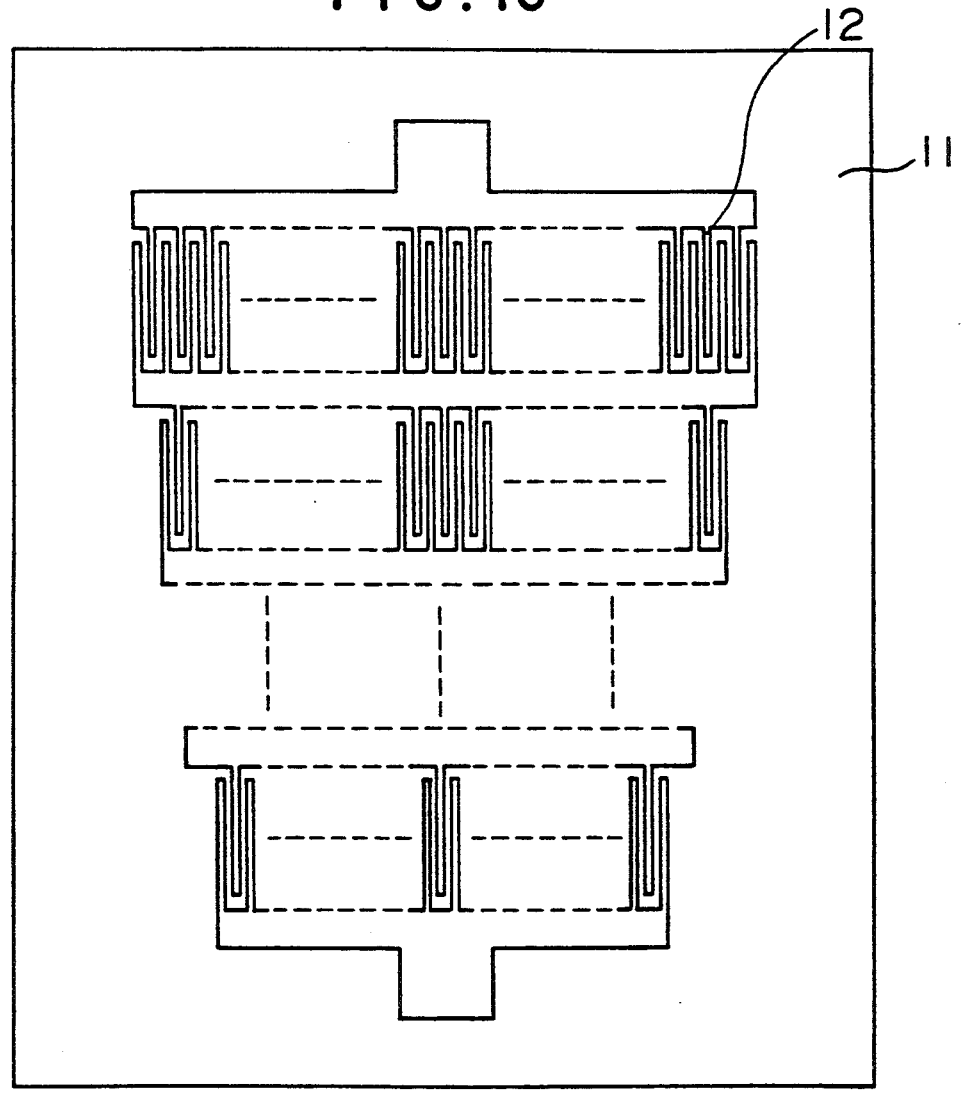

The embodiment of the invention described above is directed to the two-port SAW resonator incorporating the reflectors each composed of the metallic film strips. It should however be understood that the additive is not restricted to Ti, but Zn, Mg, Fe, Ni, Cr, Ga, Ge, Sn, Pd or Ta in the amount of not larger than 4 wt % may be selectively employed. Further, the invention can be equally applied to the one-port SAW resonator in addition to the illustrated two-port SAW resonator. For example, the invention can be effectively applied to a SAW filter adapted to transmit electric power from a plurality of parallel input electrodes 12 to a plurality of parallel output electrodes 12', as is shown in FIG. 9. Further, the invention can be equally applied to a resonator realized by making use of SAW transmitting-/receiving devices such a multi-stage serial structure shown in FIG. 10, by way of example. Moreover, the invention can be effectively applied to a SAW filter for high power transmission as well as a resonator realized by making use of the SAW transmitting/receiving devices. The invention is never restricted to the use of a substrate made of ST-cut quartz crystal. Various other substrates such as $LiNbO_3$, $LiTaO_3$ or the like may be selectively used. Of course, the invention is not restricted to any particular cut face orientation.

According to the embodiments of the invention described above in conjunction with FIGS. 4 to 11, there can be implemented SAW devices which allow facilitated etching and wire bonding at a high yield and enjoy twice or more high power handling capability when compared with the hitherto known devices having the electrodes formed of Al added with Cu through EB evaporation or vacuum evaporation.

In all the embodiments described above, the sputtering conditions may be set, for example, as follows:

| Substrate temperature | room temperature to 300° C. |
|---|---|
| Sputtering power | 0.2 to 1 kW |
| Pressure of Ar-gas | 0.1 to 10 Pa |

We claim:
1. A SAW device comprising:
a piezoelectric substrate; and
at least one set of interleaved electrodes formed on said substrate and mainly consisting of Al, at least one set of electrodes containing an additive of another metal, added to said Al, selected from the group consisting of Zn, and Ge, said SAW device being capable of operating at at least one of a higher power, frequency and amplitude signals than a SAW device having Al-Cu electrodes.

2. A SAW device according to claim 1, wherein the content of said additive in said at least one set of electrodes is not larger than 4 wt %.

3. A SAW device comprising:
   a piezoelectric substrate; and
   at least one set of interleaved electrodes formed on said substrate and mainly consisting of a sputtered Al film, said at least one set of interleaved electrodes containing an additive of another metal added to the Al film, said another metal being selected from the group consisting of Zn, and Ge, said SAW device being capable of operating at at least one of a higher power, frequency and amplitude signals than a SAW device having Al-Cu electrodes.

4. A SAW device according to claim 3, wherein the content of said additive in said at least one set of electrodes is not larger than 4 wt %.

* * * * *